US012580494B2

(12) United States Patent
Ono et al.

(10) Patent No.: US 12,580,494 B2
(45) Date of Patent: Mar. 17, 2026

(54) INVERTER, METHOD OF CONTROLLING INVERTER, PROGRAM OF CONTROLLING INVERTER

(71) Applicant: NABTESCO CORPORATION, Tokyo (JP)

(72) Inventors: Yasuo Ono, Tokyo (JP); Michael Haider, Zurich (CH); Dominik Bortis, Zurich (CH); Johann W. Kolar, Zurich (CH)

(73) Assignee: NABTESCO CORPORATION, Tokyo (JP)

(*) Notice: Subject to any disclaimer, the term of this patent is extended or adjusted under 35 U.S.C. 154(b) by 275 days.

(21) Appl. No.: 18/356,723

(22) Filed: Jul. 21, 2023

(65) Prior Publication Data

US 2023/0361692 A1 Nov. 9, 2023

Related U.S. Application Data

(63) Continuation of application No. PCT/JP2022/001972, filed on Jan. 20, 2022.

(30) Foreign Application Priority Data

Jan. 22, 2021 (JP) ................................. 2021-009124

(51) Int. Cl.
$H02M\ 1/08$ (2006.01)
$H02M\ 1/00$ (2006.01)
(Continued)

(52) U.S. Cl.
CPC ......... H02M 7/537 (2013.01); H02M 1/0054 (2021.05); H02M 1/08 (2013.01); H02P 27/06 (2013.01); H03K 17/687 (2013.01)

(58) Field of Classification Search
CPC .......... H02M 7/42; H02M 7/48; H02M 7/487; H02M 7/493; H02M 7/501; H02M 7/4826;
(Continued)

(56) References Cited

U.S. PATENT DOCUMENTS 9,917,435 B1 * 3/2018 Lu ........................... H02M 1/08
10,284,092 B1 5/2019 Elsayad et al.
(Continued)

FOREIGN PATENT DOCUMENTS

JP H10108474 A 4/1998
JP 2002135973 A 5/2002
(Continued)

OTHER PUBLICATIONS

EPO Extended European Search Report for corresponding EP Application No. 22742643.4; Issued Dec. 4, 2024.
(Continued)

*Primary Examiner* — Bryan R Perez
(74) *Attorney, Agent, or Firm* — CANTOR COLBURN LLP

(57) ABSTRACT

An inverter includes: a high electric potential input terminal, a low electric potential input terminal, an output terminal that outputs AC power, a transistor pair, a driver that performs complementary switching control of the transistor pair. The driver includes a current adjustment element that adjusts the channel current and a voltage adjustment element that adjusts the channel voltage of the transistor pair, and adjusts, in the switching control of the transistor pair, the time change rate of the channel current to be larger than the time change rate of the channel voltage.

8 Claims, 10 Drawing Sheets

(51) Int. Cl.

| | |
|---|---|
| *H02M 7/537* | (2006.01) |
| *H02P 27/06* | (2006.01) |
| *H03K 17/687* | (2006.01) |

(58) Field of Classification Search

CPC ...... H02M 7/49; H02M 7/4807; H02M 7/537; H02M 7/5387; H02M 7/533; H02M 7/53; H02M 7/53871; H02M 2007/4803; H02M 2007/4822; H02M 2007/4835; H01M 1/08

See application file for complete search history.

(56) References Cited

U.S. PATENT DOCUMENTS

| | | | |
|---|---|---|---|
| 2017/0371367 A1* | 12/2017 | Liu | ........................ H02M 7/533 |
| 2018/0062510 A1 | 3/2018 | Trescases et al. | |
| 2019/0260306 A1 | 8/2019 | Ma | |
| 2020/0350832 A1 | 11/2020 | Maki et al. | |

FOREIGN PATENT DOCUMENTS

| | | |
|---|---|---|
| JP | 2004242475 A | 8/2004 |
| JP | 2007014361 A | 1/2007 |
| JP | 2009131036 A | 6/2009 |
| JP | 2012147671 A | 8/2012 |
| JP | 2013240162 A | 11/2013 |
| JP | 2020036424 A | 3/2020 |
| JP | 2020080644 A | 5/2020 |
| WO | 2016136187 A1 | 9/2016 |

OTHER PUBLICATIONS

JPO Office Action for corresponding JP Application No. 2022-576739; Issued Oct. 8, 2024.

Shimomura et al; "High Speed dV/dt Control Technology for a SiC Power Module for EV/HEV Inverters Using a Multistage Drive Circuit", 2018 IEEE Energy Conversion Congress and Exposition, Sep. 23, 2018; pp. 3542-3546, XP03346411.

Perez et al: "Circuit Topologies, Modeling, Control Schemes, and Applications of Modular Multilevel Converters", IEEE Transactions on Power Electronics, vol. 30, No. 1, Jan. 1, 2015, pp. 4-7, XP011557536.

International Search Report for International Application No. PCT/JP2022/001972; Mailing Date, Apr. 19, 2022.

PCT International Preliminary Report on Patentability with Written Opinion of the International Searching Authority for International Application No. PCT/JP2022/001972; Mailing Date, Apr. 19, 2022.

JPO Notification of Reason(s) for Refusal for corresponding JP Application No. 2022-576739; Issued Jun. 4, 2024.

* cited by examiner

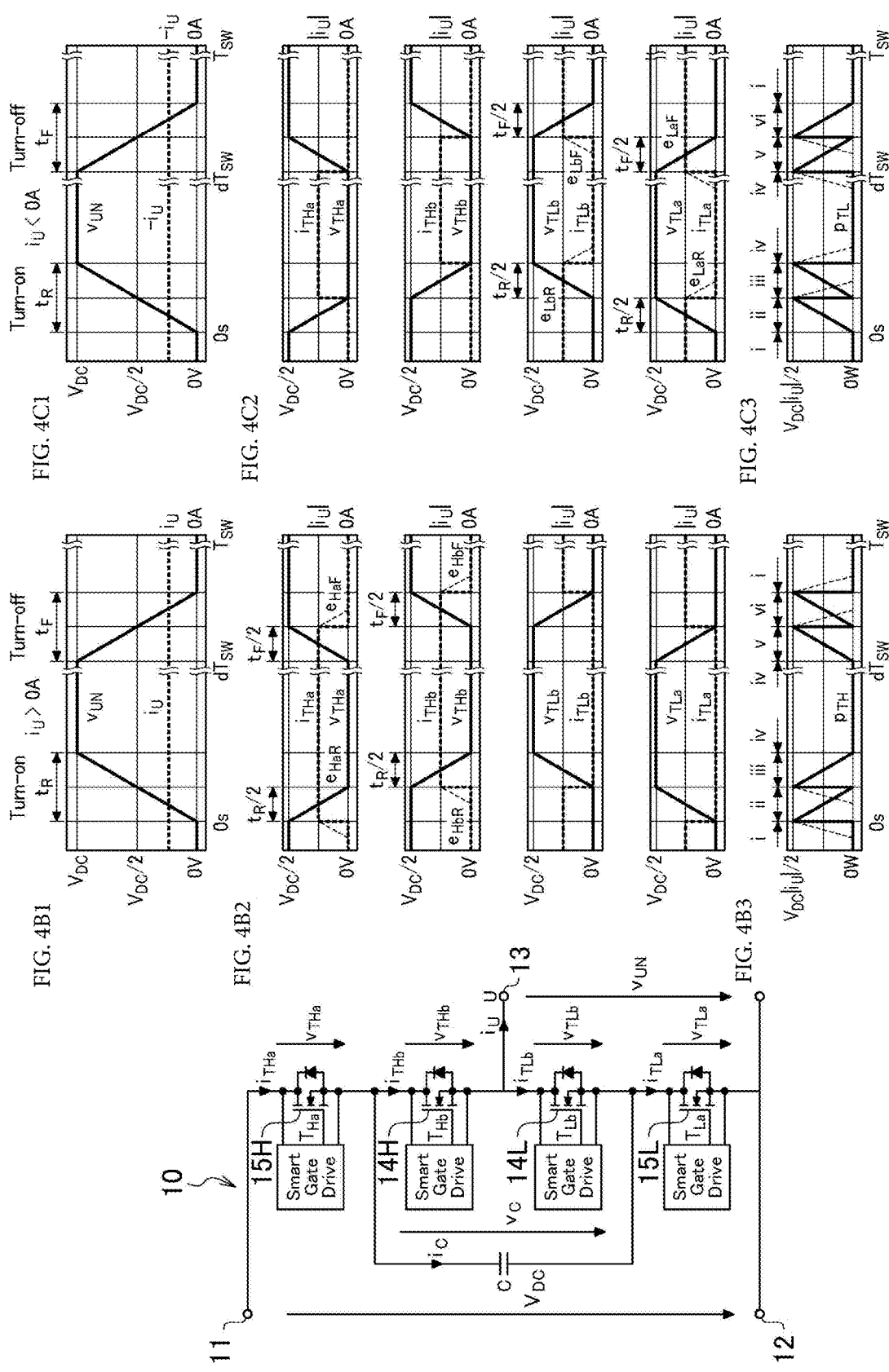

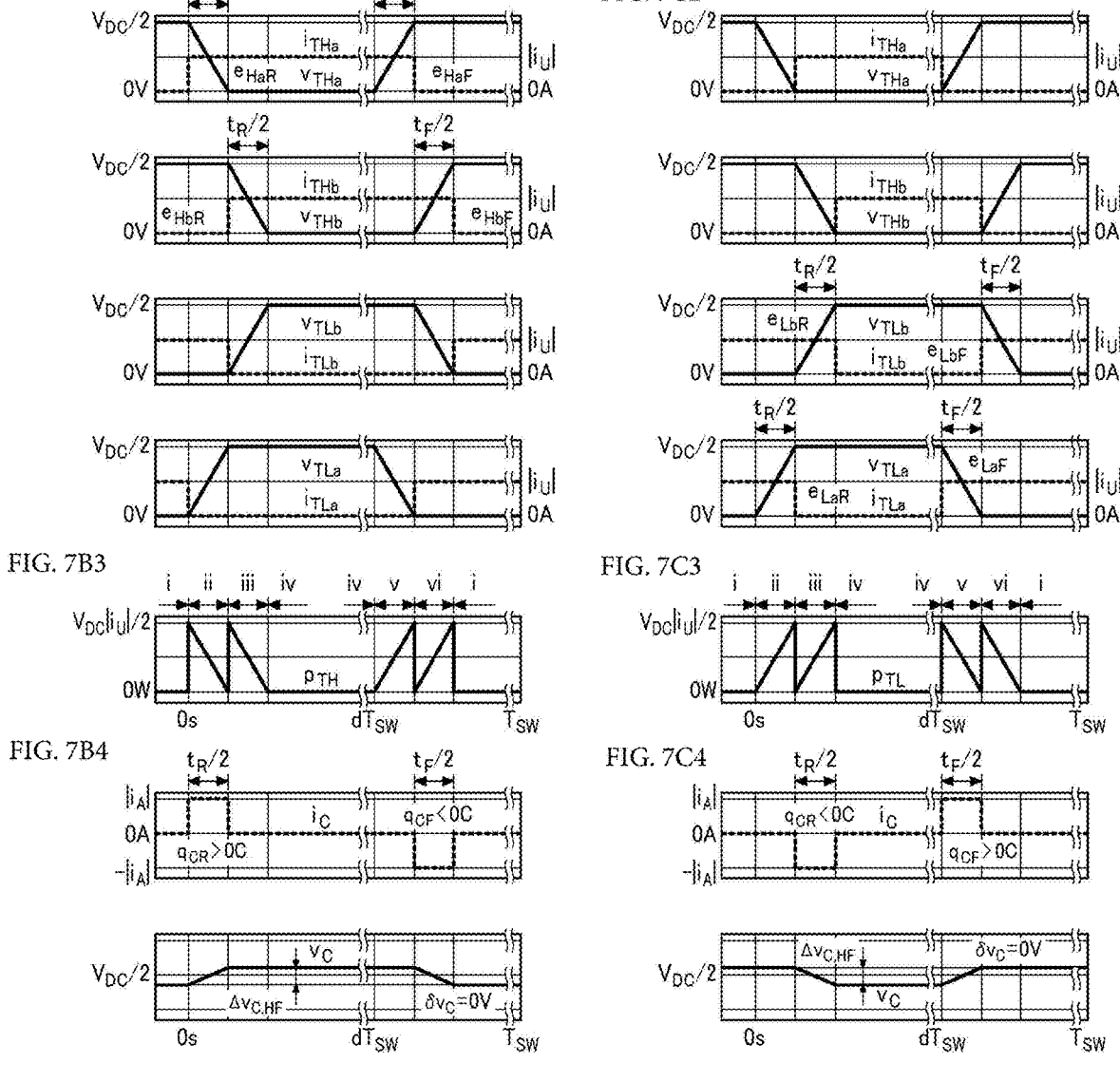

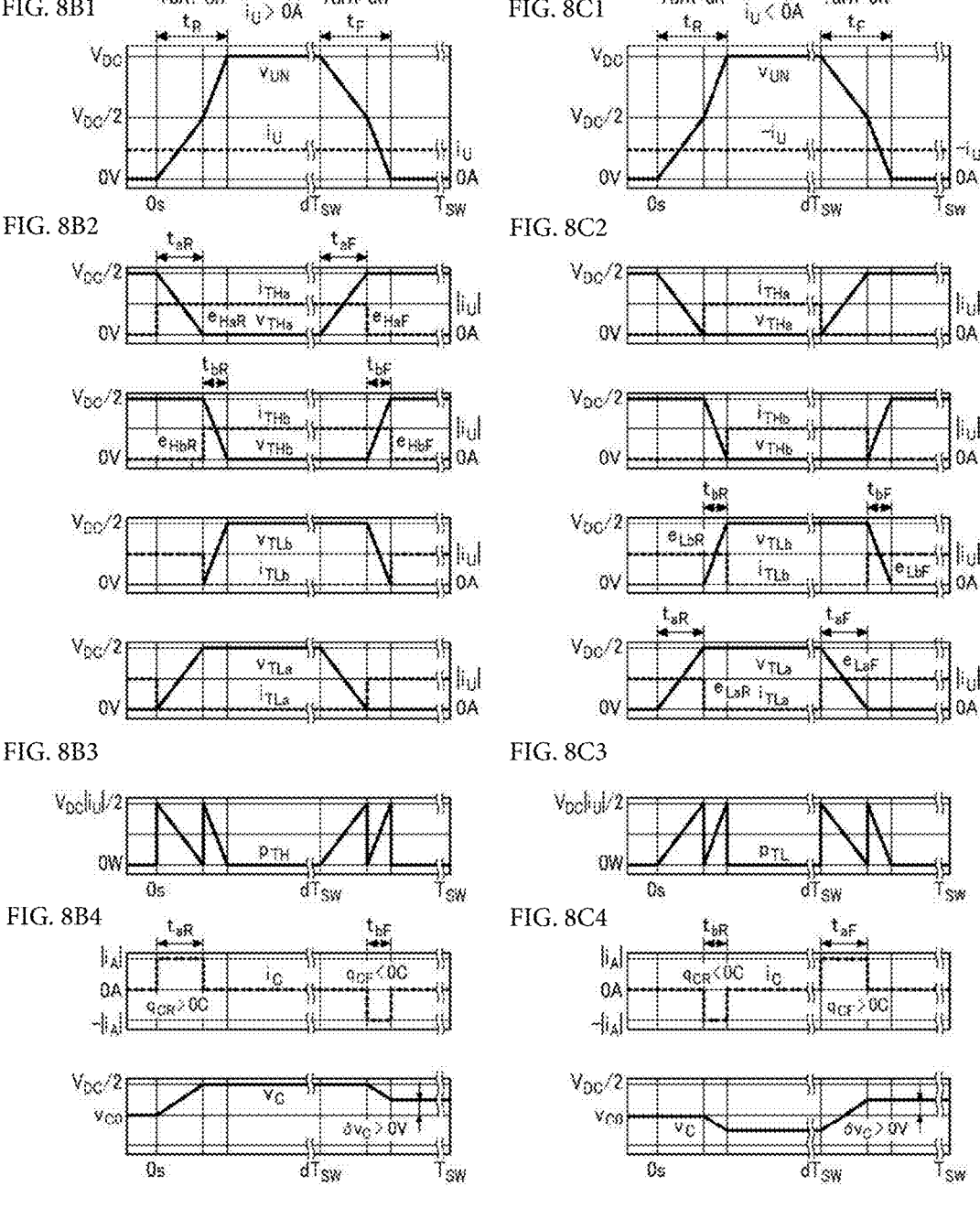
FIG. 8B1
FIG. 8C1
FIG. 8B2
FIG. 8C2
FIG. 8B3
FIG. 8C3
FIG. 8B4
FIG. 8C4

INVERTER, METHOD OF CONTROLLING INVERTER, PROGRAM OF CONTROLLING INVERTER

CROSS REFERENCE TO RELATED APPLICATIONS

This application is a continuation under 35 U.S.C. § 120 of PCT/JP2022/001972, filed Jan. 20, 2022, which is incorporated herein by reference, and which claimed priority to Japanese Application No. 2021-009124, filed Jan. 22, 2021. The present application likewise claims priority under 35 U.S.C. § 119 to Japanese Application No. 2021-009124, filed Jan. 22, 2021, the entire content of which is also incorporated herein by reference.

BACKGROUND OF THE PRESENT INVENTION

1. Field of the Present Invention

The present invention relates to control technology for inverter and/or converter.

2. Description of the Related Art

An inverter used to drive a motor and the like by AC, outputs AC power by complementary on/off control of a transistor pair on the high and low electric potential sides of an output terminal. A converter outputs DC power from AC power by the reverse operation of an inverter.

Patent Literature 1: JP Patent Application Publication 2020-80644

SUMMARY OF THE PRESENT INVENTION

In the on/off control of each transistor, when the transistor is on, the current path (i.e., a channel between a source and a drain in case the transistor is a MOSFET (Metal Oxide Semiconductor Field Effect Transistor), and a path between an emitter and a collector in case the transistor is a bipolar transistor) is in a conductive state, therefore the current flows and the voltage can be regarded as zero. Besides, when the transistor is off, the current path is in a non-conductive state, therefore the current can be regarded as zero and the voltage is generated. Since the voltage is zero when the transistor is on and the current is zero when the transistor is off, the transistor would consume no power. However, when the transistor switches between on and off, both of the voltage and the current are non-zero, resulting in unwanted power consumption known as the switching loss.

The present invention was made in consideration of such a situation, and its purpose is to provide an inverter and/or a converter that can reduce the switching loss.

In order to solve the above issue, an inverter in a certain aspect of the present invention includes: an input terminal including a high electric potential input terminal with high electric potential and a low electric potential input terminal with low electric potential, wherein DC power is input between both input terminals; an output terminal that outputs AC power; a transistor pair comprising a high electric potential transistor having a current path connecting the high electric potential input terminal side and the output terminal side, and a low electric potential transistor having a current path connecting the low electric potential input terminal side and the output terminal side; and a driver that inputs a control signal to the respective high electric potential transistor and the low electric potential transistor to perform switching control to convert the DC power to the AC power by complementarily switching the conduction state of the respective current paths. The driver includes at least one of a current adjustment element that adjusts the current of the respective current paths and a voltage adjustment element that adjusts the voltage of the respective current paths, and at least one of the current adjustment element and the voltage adjustment element adjusts, in the switching control, the time change rate of the current of the respective current paths to be larger than the time change rate of the voltage of the respective current paths.

Conventional inverter in general simply switches between on and off of each transistor in accordance with a control signal input to a control electrode (i.e., a gate electrode in case the transistor is a MOSFET, and a base electrode in case the transistor is a bipolar transistor). As such, the time change rate when the current is switched, does not differ from the time change rate when the voltage is switched. In contrast, according to the inverter of the present aspect, the time change rate of the current is adjusted to be larger than the time change rate of the voltage, by at least one of the current adjustment element and the voltage adjustment element provided in the driver. Since the current switching time can be shortened by the steep current change, the switching loss associated with current switching can be reduced. On the other hand, it is preferable that the time change rate of the voltage be smaller than the time change rate of the current, because an excessive time change rate of the voltage increases the risk of electrical breakdown in the motor winding and the like. As such, according to the inverter of the present aspect, it is possible to reduce both the switching loss associated with current switching and the risk of electrical breakdown in the motor winding and the like.

The above time change rates of the current and the voltage are defined as follows. In case the current switches between the minimum value Imin and the maximum value Imax during a time T1, the time change rate of the current is expressed as (Imax−Imin)/ti, which is hereinafter also expressed as di/dt using the symbol for derivative. In case the voltage switches between the minimum value Vmin and the maximum value Vmax during a time Tv, the time change rate of the voltage is expressed as (Vmax−Vmin)/tv, which is hereinafter also expressed as dv/dt using the symbol for derivative. It should be noted that, in case the current and the voltage change in the opposite direction, the signs of the time change rates are opposite (one of which is positive (+) and another of which is negative (−)). However, in the present specification, when comparing the time change rates of the current and the voltage, their absolute values will actually be compared.

Another aspect of the present invention is a converter. The converter includes: an output terminal including a high electric potential output terminal with high electric potential and a low electric potential output terminal with low electric potential that outputs DC power between both output terminals; an input terminal to which AC power is input; a transistor pair comprising a high electric potential transistor having a current path connecting the high electric potential output terminal side and the input terminal side, and a low electric potential transistor having a current path connecting the low electric potential output terminal side and the input terminal side; and a driver that inputs a control signal to the respective high electric potential transistor and the low electric potential transistor to perform switching control to convert the AC power to the DC power by complementarily switching the conduction state of the respective current paths. The driver includes at least one of a current adjustment element that adjusts the current of the respective current paths and a voltage adjustment element that adjusts the voltage of the respective current paths, and at least one of the current adjustment element and the voltage adjustment element adjusts, in the switching control, the time change rate of the current of the respective current paths to be larger than the time change rate of the voltage of the respective current paths.

Further another aspect of the present invention is a drive apparatus. The drive apparatus includes: a motor driven by multi-phase AC power of different phases from each other; and a plurality of inverters that generate the AC power of the respective phases. The respective inverters includes: an input terminal including a high electric potential input terminal with high electric potential and a low electric potential input terminal with low electric potential, wherein DC power is input between both input terminals; an output terminal that outputs AC power; a transistor pair comprising a high electric potential transistor having a current path connecting the high electric potential input terminal side and the output terminal side, and a low electric potential transistor having a current path connecting the low electric potential input terminal side and the output terminal side; and a driver that inputs a control signal to the respective high electric potential transistor and the low electric potential transistor to perform switching control to convert the DC power to the AC power by complementarily switching the conduction state of the respective current paths. The driver includes at least one of a current adjustment element that adjusts the current of the respective current paths and a voltage adjustment element that adjusts the voltage of the respective current paths, and at least one of the current adjustment element and the voltage adjustment element adjusts, in the switching control, the time change rate of the current of the respective current paths to be larger than the time change rate of the voltage of the respective current paths.

Further another aspect of the present invention is a method of controlling an inverter. The inverter includes: an input terminal including a high electric potential input terminal with high electric potential and a low electric potential input terminal with low electric potential, wherein DC power is input between both input terminals; an output terminal that outputs AC power; a transistor pair comprising a high electric potential transistor having a current path connecting the high electric potential input terminal side and the output terminal side, and a low electric potential transistor having a current path connecting the low electric potential input terminal side and the output terminal side. The method includes a switching control step to input a control signal to the respective high electric potential transistor and the low electric potential transistor to convert the DC power to the AC power by complementarily switching the conduction state of the respective current paths. The method adjusts, in the switching control, the time change rate of the current of the respective current paths to be larger than the time change rate of the voltage of the respective current paths.

In addition, any combination of the above components, and any conversion of the expression of the present invention among methods, devices, systems, storage media, computer programs and the like are also effective as aspects of the present invention.

According to the present invention, the switching loss of an inverter and/or a converter can be reduced.

BRIEF DESCRIPTION OF THE DRAWINGS

FIG. 4A to FIG. 4C3 show operations of the inverter.

FIGS. 7B2 to FIG. 7C4 show the current and the voltage of a capacitor provided in the connection path.

FIGS. 8B1 to FIG. 8C4 shows an example where there is the increase and/or the decrease of the capacitor charge through one switching operation of the inverter.

DETAILED DESCRIPTION OF THE PRESENT INVENTION

Figure 1:
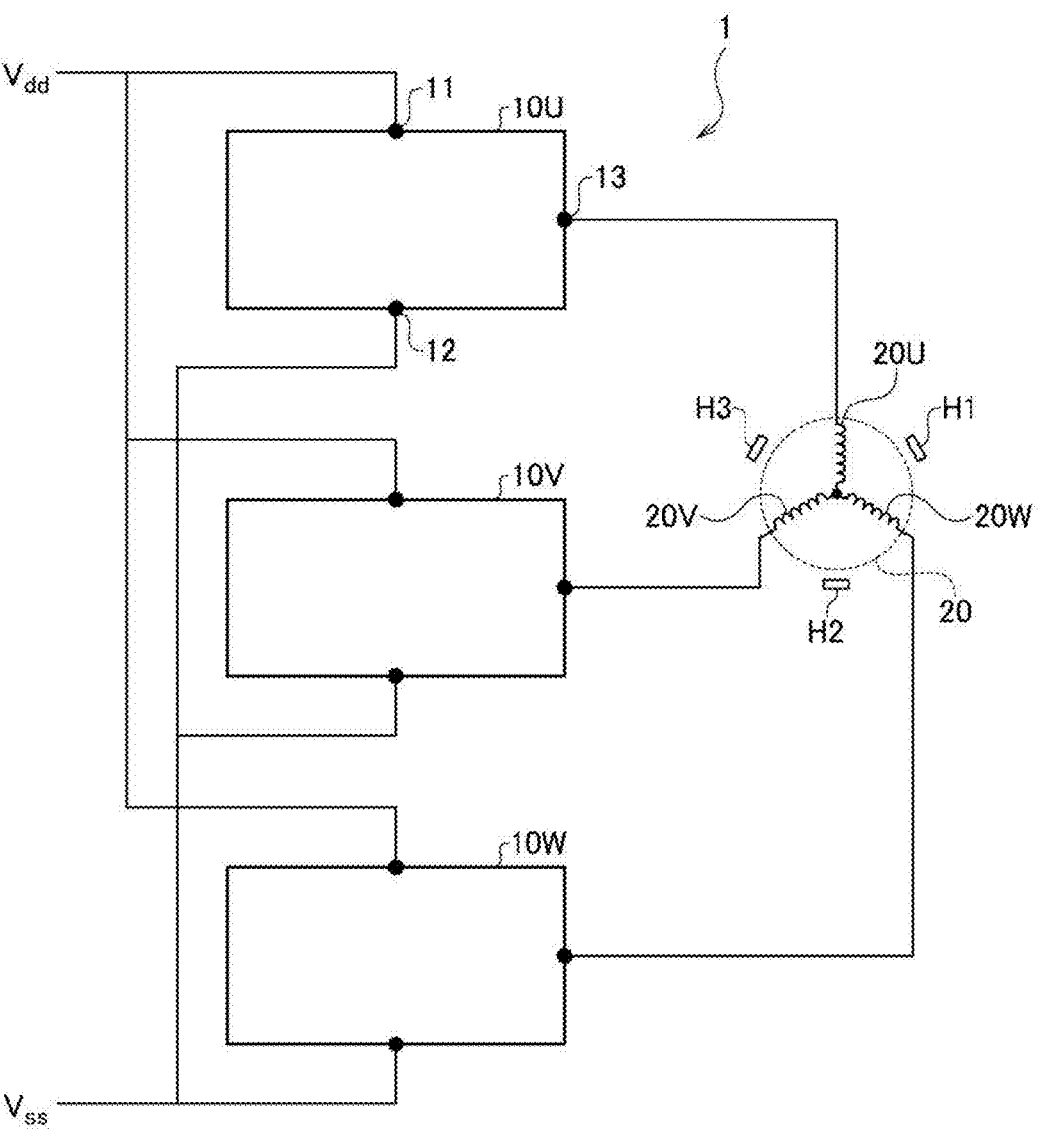
FIG. 1 schematically shows a configuration of a motor system including an embodiment of the present invention.

FIG. 1 schematically shows the configuration of a motor device 1 including an embodiment of the present invention. The motor device 1 is equipped with an inverter 10 that generates AC power based on DC power and a motor 20 that is driven by the AC power.

The motor 20 is a 3-phase brushless motor having 3-phase coils 20U, 20V, and 20W for U, V, and W phases. The inverter 10 includes a U-phase inverter 10U that generates U-phase AC power, a V-phase inverter 10V that generates V-phase AC power, and a W-phase inverter 10W that generates W-phase AC power, corresponding to each phase of the motor 20. The inverters 10U, 10V, and 10W of the respective phases generate a rotating magnetic field by applying the AC power with different phases to the coils 20U, 20V, and 20W of the respective phases, based on the rotating position of the rotor detected by the Hall elements H1, H2, and H3 of the motor 20. This rotating magnetic field rotates the rotor, from which the desired rotational power is gained. It should be noted that the motor 20 may be any other type of motor driven by AC voltage. Besides, the number of phases of the motor 20 is not limited to 3 but may be any natural number of 2 or more.

Since the configurations of inverters 10U, 10V, and 10W of the respective phases are common, they are hereinafter collectively referred to as an inverter 10 as appropriate, and its configuration, operation, and effect will be described. The inverter 10 that generates AC power, includes a high electric potential input terminal 11 to which a high DC power electric potential Vdd is input, a low electric potential input terminal 12 to which a low DC power electric potential Vss is input, and an output terminal 13 provided between the high electric potential input terminal 11 and the low electric potential input terminal 12 to output AC voltage varying between Vdd and Vss. Vss may be any electric potential lower than Vdd, but for simplicity of the description, Vss is assumed to be zero in the following. And, the DC operating voltage "Vdd−Vss=Vdd" input between both input terminals 11 and 12 of the inverter 10 is also expressed as $V_{DC}$.

Figure 2:
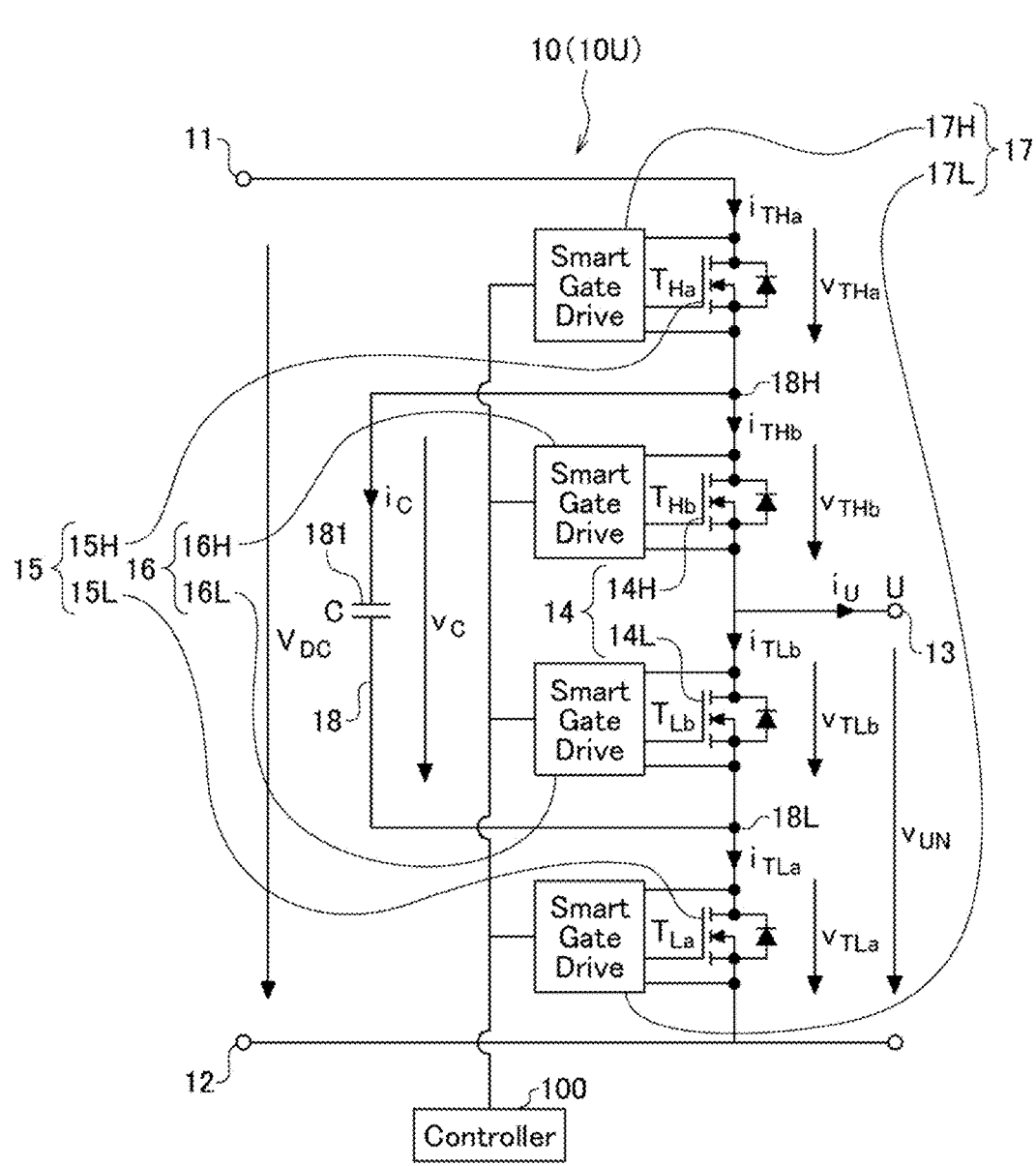
FIG. 2 schematically shows a configuration of an inverter.

FIG. 2 schematically shows the configuration of the inverter 10 (the U-phase inverter 10U). The inverter 10 includes a first transistor pair 14, a second transistor pair 15, a first driver 16, a second driver 17, a connection path 18, and a controller 100.

The first transistor pair 14 includes a first high electric potential transistor 14H with a current path connecting the high electric potential input terminal 11 side and the output terminal 13 side, and a first low electric potential transistor 14L with a current path connecting the low electric potential input terminal 12 side and the output terminal 13 side. Each transistor 14H and 14L is an N-channel type MOSFET, and the channel formed between the source and the drain in accordance with the control signal input to the gate electrode by the first driver 16 constitutes the current path. It should be noted that, these transistors 14H and 14L and/or other transistors to be described later are not limited to N channel type MOSFETs but may be configured in whole or in part by P channel type MOSFETs. Besides, these transistors are not limited to MOSFETs, but may be configured by PNP or NPN type bipolar transistors or IGBTs (Insulated Gate Bipolar Transistors).

The second transistor pair 15 includes a second high electric potential transistor 15H with a current path connecting the high electric potential input terminal 11 side and the first high electric potential transistor 14H side, and a second low electric potential transistor 15L with a current path connecting the low electric potential input terminal 12 side and the first low electric potential transistor 14L side. In other words, between the output terminal 13 and the high electric potential input terminal 11, the first high electric potential transistor 14H and the second high electric potential transistor 15H are connected in series, in the direction from the output terminal 13 to the high electric potential input terminal 11. Similarly, between the output terminal 13 and the low electric potential input terminal 12, the first low electric potential transistor 14L and the second low electric potential transistor 15L are connected in series, in the direction from the output terminal 13 to the low electric potential input terminal 12. Each transistor 15H and 15L is a MOSFET, and the channel formed between the source and the drain in accordance with the control signal input to the gate electrode by the second driver 17 constitutes the current path.

The first driver 16 includes a first high electric potential driver 16H that inputs a control signal to the gate electrode of the first high electric potential transistor 14H under the control of the controller 100, and a first low electric potential driver 16L that inputs a control signal to the gate electrode of the first low electric potential transistor 14L under the control of the controller 100. The first driver 16 performs the first switching control to convert DC power to AC power, by complementarily switching the conduction state of the current paths of the respective transistors 14H and 14L. Here, "complementarily switching" means controlling the on/off state of each transistor 14H and 14L to be opposite to each other. In other words, when the transistor 14H is on, the transistor 14L is controlled to be off; when the transistor 14H is off, the transistor 14L is controlled to be on; when the transistor 14H switches from on to off, the transistor 14L is controlled to switch from off to on; when the transistor 14H switches from off to on, the transistor 14L is controlled to switch from on to off.

The second driver 17 includes a second high electric potential driver 17H that inputs a control signal to the gate electrode of the second high electric potential transistor 15H under the control of the controller 100, and a second low electric potential driver 17L that inputs a control signal to the gate electrode of the second low electric potential transistor 15L under the control of the controller 100. The second driver 17 performs the second switching control to convert DC power to AC power, by complementarily switching the conduction state of the current paths of the respective transistors 15H and 15L. As with the first driver 16 above, "complementarily switching" means controlling the on/off state of each transistor 15H and 15L to be opposite to each other. The second switching control by the second driver 17 is performed at the timing that deviates by a predetermined time gap from the timing of the first switching control by the first driver 16, as described in detail below.

The connection path 18 interconnects the connection portion 18H of the first high electric potential transistor 14H and the second high electric potential transistor 15H, and the connection portion 18L of the first low electric potential transistor 14L and the second low electric potential transistor 15L. In the connection path 18, a capacitor 181 with a capacitance value of C is provided as an example of a voltage fluctuation suppression element.

Figure 3A:
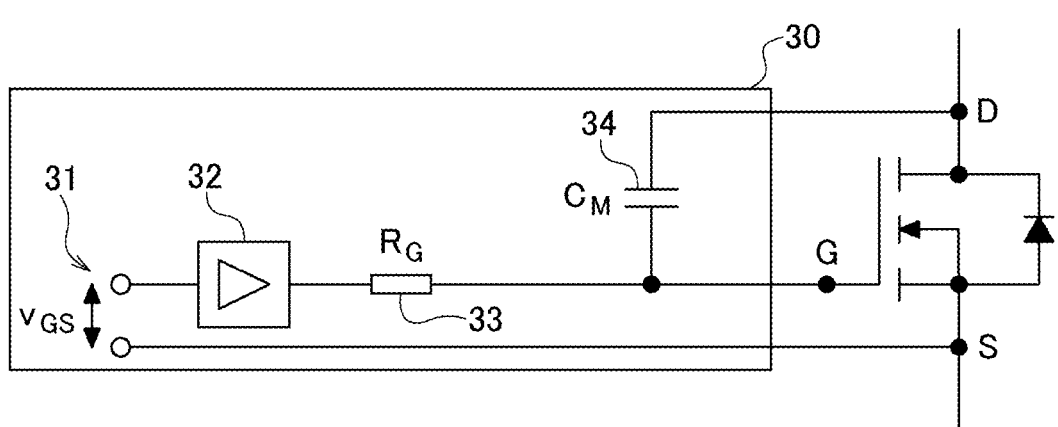
FIG. 3A and FIG. 3B show an example of a configuration of a driver.
Figure 3B:
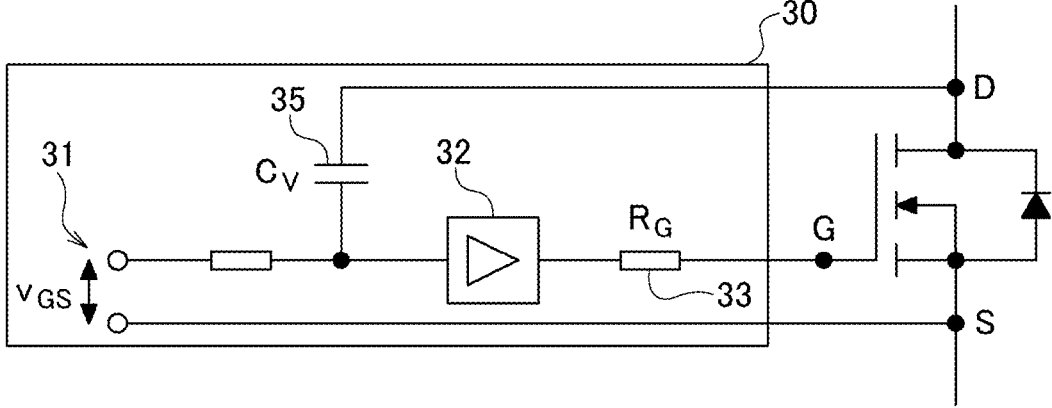

Before describing the operation of the inverter 10 with the above configuration, the detailed configurations of the drivers 16H, 16L, 17H, and 17L will be described with reference to FIG. 3A and FIG. 3B. Since the configurations of the respective drivers 16H, 16L, 17H, and 17L are common, they are collectively referred to as a driver 30 in FIG. 3A and FIG. 3B. FIG. 3A and FIG. 3B show two examples of the configuration of the driver 30.

The driver 30 according to the first configuration example in FIG. 3A includes: a pair of voltage input terminals 31 to which a voltage $v_{GS}$ corresponding to the gate/source voltage of the transistor to be driven is input; an operational amplifier 32 connected to the voltage input terminal 31 on the gate side; a gate resistor 33 with a resistance value of $R_G$ provided between the operational amplifier 32 and the gate electrode; and a mirror capacitor 34 with a capacitance value of $C_M$ provided in the branch line that branches from between the gate resistor 33 and the gate electrode to connect to the drain of the transistor. It should be noted that the input voltage $v_{GS}$ is generated by the controller 100 shown in FIG. 2.

The gate resistor 33 functions as a current adjustment element that adjusts the channel current when the transistor is switched between on and off. Specifically, the resistance value $R_G$ can adjust the time change rate of the current di/dt when the transistor is switched between on and off. If the resistance value $R_G$ is increased, di/dt becomes smaller, and if the resistance value $R_G$ is decreased, di/dt becomes larger. As described below, it is preferable to increase di/dt and to decrease the resistance value $R_G$ in the present embodiment. According to a simulation conducted by the present inventor, substantially the infinite di/dt can be realized within a realistic range of the resistance value $R_G$. In this case, when the transistor switches between on and off, the current instantaneously switches between the minimum value and the maximum value. Since the current switching time can be reduced to substantially zero by such a steep current change, the switching loss associated with the current switching can be reduced. It should be noted that the di/dt when the transistor is switched between on and off may be precisely controlled, by varying the resistance value $R_G$ even during the operation of the driver 30.

The mirror capacitor 34 functions as a voltage adjustment element that adjusts the channel voltage when the transistor is switched between on and off. Specifically, the capacitance value $C_M$ can adjust the time change rate of the voltage dv/dt when the transistor is switched between on and off. In order to reduce switching loss associated with the voltage switching, it is preferable to increase dv/dt as well as di/dt above. However, on the other hand, if dv/dt is increased too much, the risk of electrical breakdown of the coils 20U, 20V, and 20W of the motor 20 increases. As such, the capacitance value $C_M$ is set to an appropriate value, and dv/dt is made as large as possible within the acceptable risk of electrical breakdown. As a result, the dv/dt with such a constraint is adjusted to be smaller than the di/dt without such a constraint. It should be noted that the dv/dt when the transistor is switched between on and off may be precisely controlled, by varying the capacitance value $C_M$ even during the operation of the driver 30.

The operational amplifier 32 can function as both a current adjustment element and a voltage adjustment element by adjusting its configuration and/or parameters as appropriate. The adjustment targets of the di/dt and the dv/dt are as described above, with di/dt as large as possible (substantially the infinite) and dv/dt as large as possible within the acceptable risk of electrical breakdown.

The driver 30 according to the second configuration example in FIG. 3B includes: a pair of voltage input terminals 31 to which a voltage vas corresponding to the gate/source voltage of the transistor to be driven is input; an operational amplifier 32 connected to the voltage input terminal 31 on the gate side; a gate resistor 33 with a resistance value of $R_G$ provided between the operational amplifier 32 and the gate electrode; and a capacitor 35 with a capacitance value of $C_V$ provided in the branch line that branches from between the voltage input terminal 31 on the gate side and the operational amplifier 32 to connect to the drain of the transistor. Only the capacitor 35 is different from the first configuration example in FIG. 3A.

Similar to the mirror capacitor 34, the capacitor 35 functions as a voltage adjustment element that adjusts the channel voltage when the transistor is switched between on and off. Specifically, the capacitance value $C_V$ can adjust the time change rate of the voltage dv/dt when the transistor is switched between on and off. The dv/dt when the transistor is switched between on and off may be precisely controlled, by varying the capacitance value $C_V$ even during the operation of the driver 30, similar to the capacitance value $C_M$ of the mirror capacitor 34. Furthermore, according to capacitor 35, not only the output waveform of driver 30, but also the output waveform of the entire inverter 10 can be adjusted, therefore suppressing unnecessary electromagnetic noise emission.

The operation of the inverter 10 with the above configuration is shown in FIG. 4A-FIG. 4C3. FIG. 4A shows the configuration of the inverter 10 shown in FIG. 2. FIG. 4B shows the operation in which the current $i_U$ flowing through the output terminal 13 is positive. FIG. 4C shows the operation in which the current $i_U$ flowing through the output terminal 13 is negative. The current $i_U$ is positive when it flows out of the output terminal 13 in FIG. 4A and negative when it flows into the output terminal 13. FIGS. 4B1 and FIG. 4C1 show the voltage and the current appearing at the output terminal 13. FIGS. 4B2 and FIG. 4C2 show the voltage and the current in the channels between the sources and the drains of the four transistors 15H, 14H, 14L, and 15L. FIGS. 4B3 and FIG. 4C3 show the switching loss of the inverter 10.

First of all, FIG. 4B showing the case where the current $i_U$ is positive will be described. FIG. 4B1 shows the voltage and the current appearing at the output terminal 13 when the inverter 10 performs one switching operation. As described in detail below, the voltage is a trapezoidal pulse with a height of $V_{DC}$ (Vdd–Vss), and the magnitude of the current $i_U$ is constant. During the period from time 0s to the rise time $t_R$, the transistors 15H and 14H on the high electric potential side are sequentially turned on, and, complementary to that, the transistors 15L and 14L on the low electric potential side are sequentially turned off, so that the voltage at the output terminal 13 increases linearly from 0V to $V_{DC}$. After the rise time $t_R$, the magnitude of the voltage remains constant at $V_{DC}$ until the switch-off time $dT_{SW}$. In other words, the switch-off time $dT_{SW}$ determines the width of the trapezoidal voltage pulse. By varying the width or duty ratio of each voltage pulse using general pulse width modulation (PWM) technology, an AC voltage of the desired frequency is generated. During the period from the switch-off time $dT_{SW}$ to the fall time $t_F$, the transistors 15H and 14H on the high electric potential side are sequentially turned off, and, complementary to that, the transistors 15L and 14L on the low electric potential side are sequentially turned on, so that the voltage at the output terminal 13 decreases linearly from $V_{DC}$ to 0V.

Figure 5:
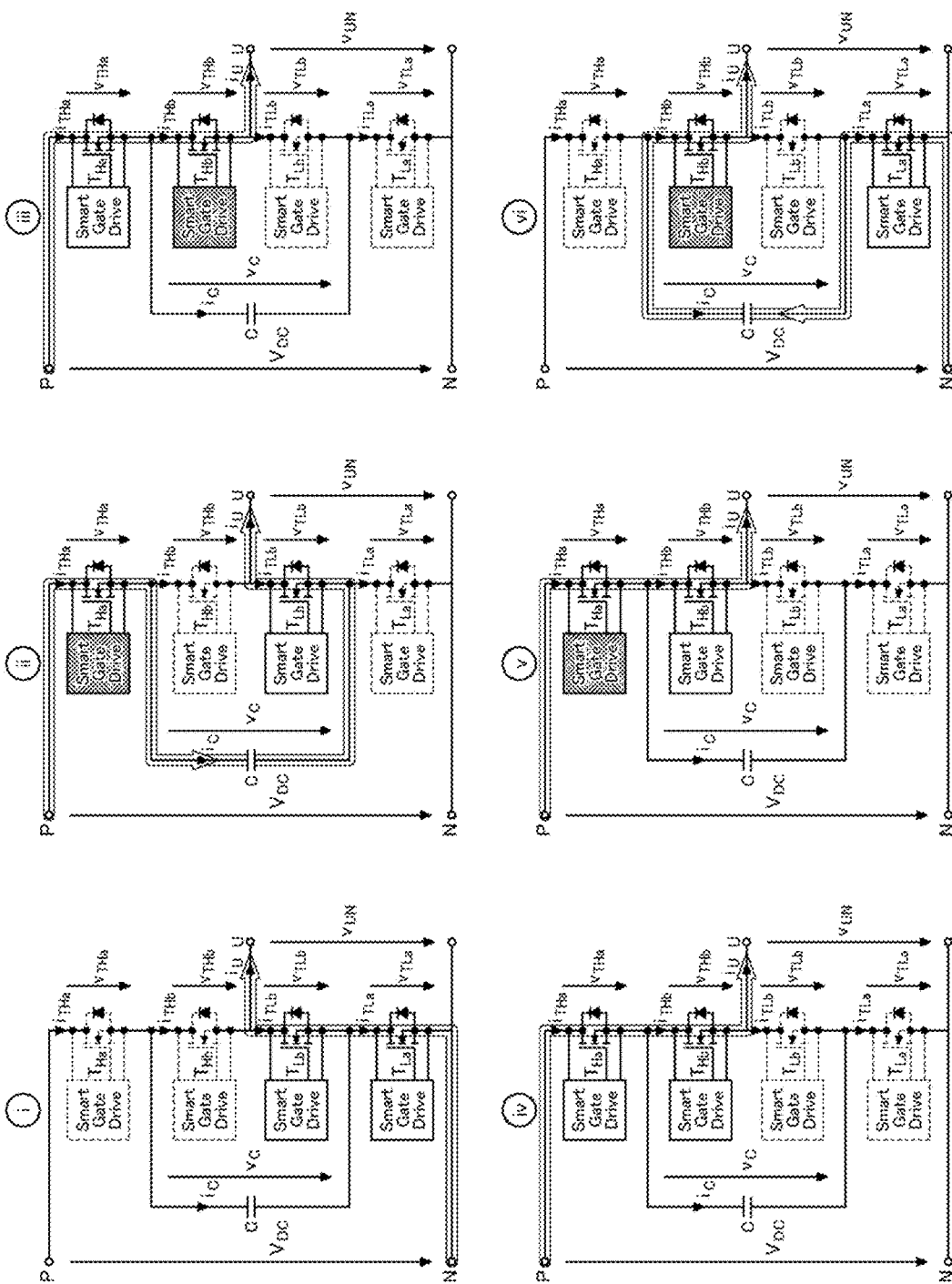
FIG. 5 shows the conduction state of each transistor and the current path in case the output current is positive.

In describing the operations of the four transistors 15H, 14H, 14L, and 15L in FIG. 4B2, time period is divided into six sections i-vi shown in FIG. 4B3. FIG. 5 shows the conduction state and the current path of each transistor in each section i-vi. The current $i_U$ flowing through the output terminal in FIG. 5 is positive in all sections and its magnitude is constant as shown in FIG. 4B1.

In the section i before time 0s, the transistors 15H and 14H are in the off state and the transistors 14L and 15L are in the on state. The voltage at the output terminal 13 is 0V because the low electric potential input terminal 12 is conducting with the output terminal 13. The voltage $V_{DC}$ between the high electric potential input terminal 11 and the output terminal 13 is equally divided by the transistors 15H and 14H, therefore the voltage of each transistor is $V_{DC}/2$. The voltage of the transistors 14L and 15L in the on state is 0V, and the current $i_U$ flows.

In the section ii from time 0s to $t_R/2$, the on/off states of the transistors 15H and 15L are complementarily switched. Specifically, the transistor 15H switches from the off state to the on state and the transistor 15L switches from the on state to the off state. This corresponds to the second switching control according to the present invention. As shown in FIG. 5, as the transistor 15H is switching to the on state, the current from the high electric potential input terminal 11 flows through the transistor 15H and then flows through the output terminal 13 via the capacitor 181 in the connection path 18 and the transistor 14L in the on state. Looking at the voltage and the current of the transistors 15H and 15L in FIG. 4B2, the time change rate of the voltage dv/dt is "$(V_{DC}/2)/(t_R/2)=V_{DC}/t_R$", and the time change rate of the current di/dt is the infinite. In other words, the voltage changes linearly over the section ii from 0s to $t_R/2$, while the current instantaneously switches at the start time 0s of the section ii. The configuration for adjusting dv/dt and di/dt in this way was described in FIG. 3A and FIG. 3B.

In the section iii from $t_R/2$ to $t_R$, the on/off states of the transistors 14H and 14L are complementarily switched. Specifically, the transistor 14H switches from the off state to the on state and the transistor 14L switches from the on state to the off state. This corresponds to the first switching control according to the present invention. As shown in FIG.

5, as the transistor 14H is switching to the on state, the current from the high electric potential input terminal 11 flows through the transistor 14H via the transistor 15H in the on state. Looking at the voltage and the current of the transistors 14H and 14L in FIG. 4B2, the time change rate of the voltage dv/dt is "$(V_{DC}/2)/(t_R/2)=V_{DC}/t_R$", and the time change rate of the current di/dt is the infinite. In other words, the voltage changes linearly over the section iii from $t_R/2$ to $t_R$, while the current instantaneously switches at the start time $t_R/2$ of the section iii.

As described above, in the section ii, the second switching control in which the on/off states of the transistors 15H and 15L are complementarily switched is performed, and in the subsequent section iii, the first switching control in which the on/off states of the transistors 14H and 14L are complementarily switched is performed. As such, the second switching control is performed before the first switching control. In other words, the timing of the switching control of the respective transistor pairs is earlier for the transistor pair on the far side from the output terminal 13 (the second transistor pair 15 in the present example). Besides, the timings of the second switching control and the first switching control are deviated by the transient time $t_R/2$ of the voltage switching of the respective channels of the transistors 15H and 15L in the second switching control (the section ii). As such, immediately after the voltage switching of the transistors 15H and 15L in the section ii, the voltage of the transistors 14H and 14L switches in the section iii without any time gap. Furthermore, as mentioned above, the time change rates of the voltage dv/dt in the sections ii and iii, are equal to each other at $V_{DC}/t_R$. As a result, the voltage waveform smoothly connected at time $t_R/2$ is obtained, as shown in FIG. 4B1. If the timing deviation of the second switching control and the first switching control is significantly different from $t_R/2$, the output voltage stays around the intermediate voltage $V_{DC}/2$ from the end time $t_R/2$ of the second switching control to the start time of the first switching control. Therefore, the voltage pulse is not a single trapezoidal voltage pulse as in FIG. 4B1, but a staircase-shaped voltage pulse with three levels: 0V, $V_{DC}/2$, and $V_{DC}$. Although the staircase-shaped voltage pulse does not significantly interfere with the operation of the inverter 10, the trapezoidal voltage pulse is preferred if there are requirements for adjusting the voltage pulse waveform. The trapezoidal voltage pulse takes two levels, 0V and $V_{DC}$. This can be referred to as "3 level/pseudo 2 level control" because the natural 3 levels of 0V, $V_{DC}/2$, and $V_{DC}$ are now pseudo 2 levels of 0V and $V_{DC}$.

In the section iv from time $t_R$ to $dT_{SW}$, the state at the end of the section iii is maintained as is, and a voltage pulse of the desired width is formed based on pulse width modulation. In the section iv, the transistors 15H and 14H are in the on state and the transistors 14L and 15L are in the off state. The voltage at the output terminal 13 is $V_{DC}$ because the high electric potential input terminal 11 is conducting with the output terminal 13. The voltage $V_{DC}$ between the low electric potential input terminal 12 and the output terminal 13 is equally divided by the transistors 14L and 15L, therefore the voltage of each transistor is $V_{DC}/2$. The voltage of the transistors 15H and 14H in the on state is 0V, and the current $i_U$ flows.

In the section v from time $dT_{SW}$ to $dT_{SW}+t_F/2$, the on/off states of the transistors 15H and 15L are complementarily switched. Specifically, the transistor 15H switches from the on state to the off state and the transistor 15L switches from the off state to the on state. Similar to the section ii, this also corresponds to the second switching control according to the present invention. As shown in FIG. 5, similar to the section iv, the current $i_U$ flows through the transistor 15H and 14H. Looking at the voltage and the current of the transistors 15H and 15L in FIG. 4B2, the time change rate of the voltage dv/dt is "$(V_{DC}/2)/(t_F/2)=V_{DC}/t_F$", and the time change rate of the current di/dt is the infinite. In other words, the voltage changes linearly over the section v from $dT_{SW}$ to $dT_{SW}+t_F/2$, while the current instantaneously switches at the end time $dT_{SW}+t_F/2$ of the section v.

In the section vi from $dT_{SW}+t_F/2$ to $dT_{SW}+t_F$, the on/off states of the transistors 14H and 14L are complementarily switched. Specifically, the transistor 14H switches from the on state to the off state and the transistor 14L switches from the off state to the on state. Similar to the section iii, this also corresponds to the first switching control according to the present invention. As shown in FIG. 5, the current from the low electric potential input terminal 12 flows through the transistor 15L in the on state and then flows through the output terminal 13 via the capacitor 181 in the connection path 18 and the transistor 14H. Looking at the voltage and the current of the transistors 14H and 14L in FIG. 4B2, the time change rate of the voltage dv/dt is "$(V_{DC}/2)/(t_F/2)=V_{DC}/t_F$", and the time change rate of the current di/dt is the infinite. In other words, the voltage changes linearly over the section vi from $dT_{SW}+t_F/2$ to $dT_{SW}+t_F$, while the current instantaneously switches at the end time $dT_{SW}+t_F$ of the section vi.

As described above, in the section v, the second switching control in which the on/off states of the transistors 15H and 15L are complementarily switched is performed, and in the subsequent section vi, the first switching control in which the on/off states of the transistors 14H and 14L are complementarily switched is performed. As such, similar to the above sections ii and iii, the second switching control is performed before the first switching control. In other words, the timing of the switching control of the respective transistor pairs is earlier for the transistor pair on the far side from the output terminal 13 (the second transistor pair 15 in the present example). Besides, the timings of the second switching control and the first switching control are deviated by the transient time $t_R/2$ of the voltage switching of the respective channels of the transistors 15H and 15L in the second switching control (the section v). As such, immediately after the voltage switching of the transistors 15H and 15L in the section v, the voltage of the transistors 14H and 14L switches in the section vi without any time gap. Furthermore, as mentioned above, the time change rates of the voltage dv/dt in the sections v and vi, are equal to each other at $V_{DC}/t_F$. As a result, the voltage waveform smoothly connected at time $dT_{SW}+t_R/2$ is obtained, as shown in FIG. 4B1. As such, the aforementioned "3 level/pseudo 2 level control" is realized, not only on the rising side of the voltage pulse but also on the falling side.

FIG. 4B3 shows the switching loss of the inverter 10. The switching loss is the sum of the power consumed by each transistor 15H, 14H, 14L, and 15L through one switching operation of the inverter 10. Power is consumed when both of the voltage and the current are non-zero in each transistor 15H, 14H, 14L, and 15L, as shown in FIG. 4B2. Specifically, the transistor 15H consumes power in the section ii, the transistor 14H consumes power in the section iii, the transistor 15H consumes power in the section v, and the transistor 14H consumes power in the section vi. As shown in FIG. 4B3, the power consumed in each of the four sections ii, iii, v, and vi is represented by the area of the right triangle with a height of "$V_{DC}*i_U/2$". The length of the base of each right triangle is $t_R/2$ in the sections ii, iii and $t_F/2$ in the sections v, vi. Therefore, the switching loss, which is the sum of the areas of these four right triangles, is expressed as "$t_R*V_{DC}*i_U/4+t_F*V_{DC}*i_U/4$". Here, the power consumed by each transistor 15H and 14H is represented by the area of the right triangle, because the time change rate of the current di/dt in each section ii, iii, v, and vi is the infinite and the current changes instantaneously in the direction perpendicular to the time axis. As a comparative example, the case where di/dt is not the infinite is shown by the dotted line. In this case, additional switching loss occurs adjacent to the right angle portion of each of the above right triangles. Therefore, by setting di/dt to be the infinite, the switching loss can be reduced.

The operation of the inverter 10 in case the current $i_U$ is positive has been described above with reference to FIG. 4B1 to FIG. 4B3 and FIG. 5. FIG. 4C1 to FIG. 4C3 and FIG. 6 show the operation of the inverter 10 in case the current $i_U$ is negative. Since the basic contents are common, the description is simplified as appropriate.

FIG. 4C1 shows the voltage and the current appearing at the output terminal 13 when the inverter 10 performs one switching operation. The voltage is a trapezoidal pulse with a height of $V_{DC}$, and the magnitude of the current $i_U$ is constant (since $i_U$ is negative, it is shown in the positive region with a minus sign). During the period from time 0s to the rise time $t_R$, the transistors 15H and 14H on the high electric potential side are sequentially turned on, and, complementary to that, the transistors 15L and 14L on the low electric potential side are sequentially turned off, so that the voltage at the output terminal 13 increases linearly from 0V to $V_{DC}$. After the rise time $t_R$, the magnitude of the voltage remains constant at $V_{DC}$ until the switch-off time $dT_{SW}$. During the period from the switch-off time $dT_{SW}$ to the fall time $t_F$, the transistors 15H and 14H on the high electric potential side are sequentially turned off, and, complementary to that, the transistors 15L and 14L on the low electric potential side are sequentially turned on, so that the voltage at the output terminal 13 decreases linearly from $V_{DC}$ to 0V.

Figure 6:
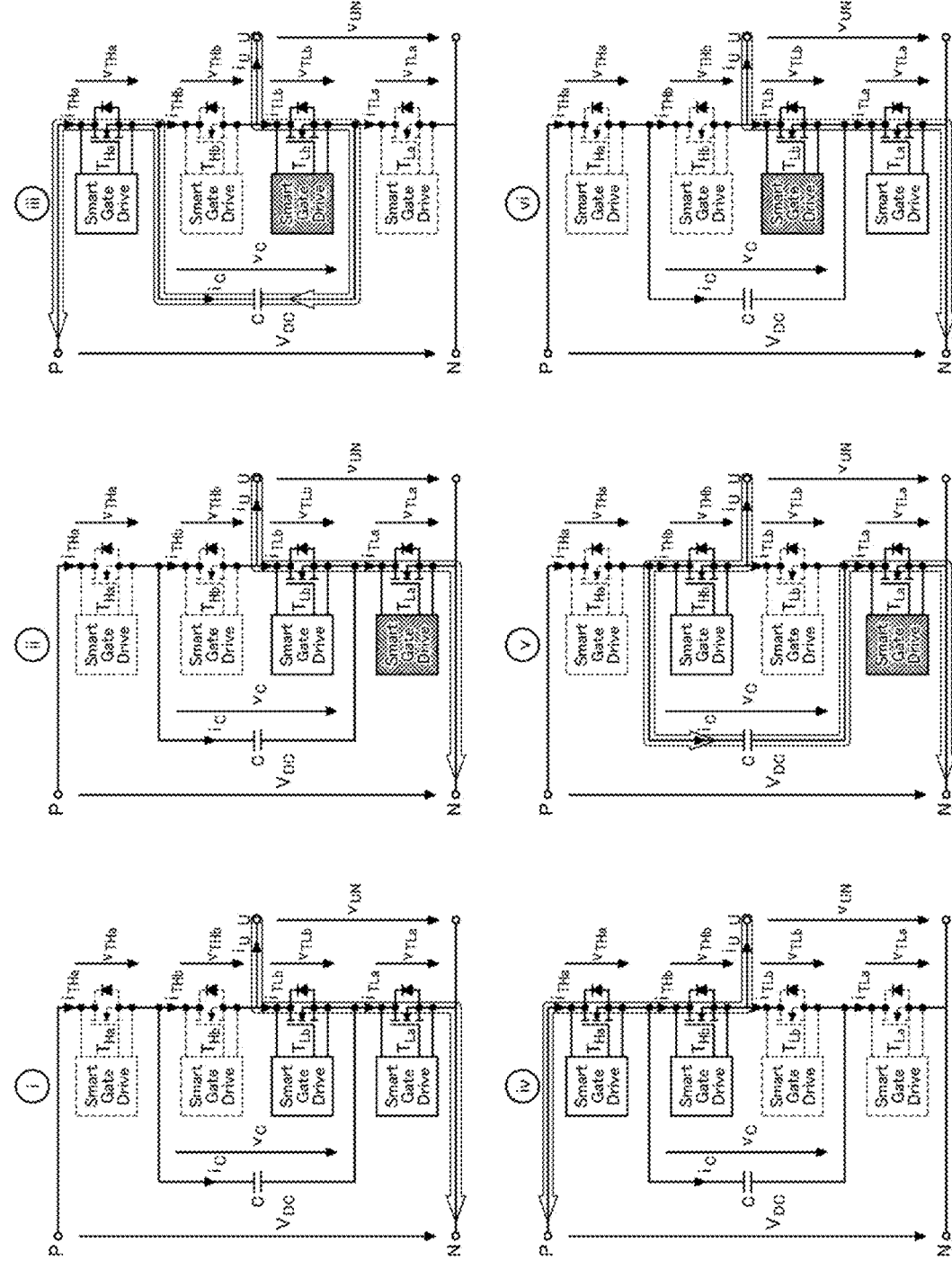
FIG. 6 shows the conduction state of each transistor and the current path in case the output current is negative.

In describing the operations of the four transistors 15H, 14H, 14L, and 15L in FIG. 4C2, time period is divided into six sections i-vi shown in FIG. 4C3. FIG. 6 shows the conduction state and the current path of each transistor in each section i-vi. The current $i_U$ flowing through the output terminal in FIG. 6 is negative in all sections and its magnitude is constant as shown in FIG. 4C1.

In the section i before time 0s, the transistors 15H and 14H are in the off state and the transistors 14L and 15L are in the on state. The voltage at the output terminal 13 is 0V because the low electric potential input terminal 12 is conducting with the output terminal 13. The voltage $V_{DC}$ between the high electric potential input terminal 11 and the output terminal 13 is equally divided by the transistors 15H and 14H, therefore the voltage of each transistor is $V_{DC}/2$. The voltage of the transistors 14L and 15L in the on state is 0V, and the current $i_U$ flows.

In the section ii from time 0s to $t_R/2$, the on/off states of the transistors 15H and 15L are complementarily switched. Specifically, the transistor 15H switches from the off state to the on state and the transistor 15L switches from the on state to the off state. This corresponds to the second switching control according to the present invention. As shown in FIG. 6, the current $i_U$ flows through the transistors 14L and 15L, similar to the section i. Looking at the voltage and the current of the transistors 15H and 15L in FIG. 4C2, the time change rate of the voltage dv/dt is "$(V_{DC}/2)/(t_R/2)=V_{DC}/t_R$", and the time change rate of the current di/dt is the infinite.

In other words, the voltage changes linearly over the section ii from 0s to $t_R/2$, while the current instantaneously switches at the end time $t_R/2$ of the section ii.

In the section iii from $t_R/2$ to $t_R$, the on/off states of the transistors 14H and 14L are complementarily switched. Specifically, the transistor 14H switches from the off state to the on state and the transistor 14L switches from the on state to the off state. This corresponds to the first switching control according to the present invention. As shown in FIG. 6, the current from the output terminal 13 flows through the transistor 14L and then flows through the high electric potential input terminal 11 via the capacitor 181 in the connection path 18 and the transistor 15H in the on state. Looking at the voltage and the current of the transistors 14H and 14L in FIG. 4C2, the time change rate of the voltage dv/dt is "$(V_{DC}/2)/(t_R/2)=V_{DC}/t_R$", and the time change rate of the current di/dt is the infinite. In other words, the voltage changes linearly over the section iii from $t_R/2$ to $t_R$, while the current instantaneously switches at the end time t of the section iii.

As described above, in the section ii, the second switching control in which the on/off states of the transistors 15H and 15L are complementarily switched is performed, and in the subsequent section iii, the first switching control in which the on/off states of the transistors 14H and 14L are complementarily switched is performed. As such, the second switching control is performed before the first switching control. Besides, the timings of the second switching control and the first switching control are deviated by the transient time $t_R/2$ of the voltage switching of the respective channels of the transistors 15H and 15L in the second switching control (the section ii). As such, immediately after the voltage switching of the transistors 15H and 15L in the section ii, the voltage of the transistors 14H and 14L switches in the section iii without any time gap. Furthermore, as mentioned above, the time change rates of the voltage dv/dt in the sections ii and iii, are equal to each other at $V_{DC}/t_R$. As a result, the voltage waveform smoothly connected at time $t_R/2$ is obtained (3 level/pseudo 2 level control), as shown in FIG. 4C1.

In the section iv from time $t_R$ to $dT_{SW}$, the state at the end of the section iii is maintained as is, and a voltage pulse of the desired width is formed based on pulse width modulation. In the section iv, the transistors 15H and 14H are in the on state and the transistors 14L and 15L are in the off state. The voltage at the output terminal 13 is $V_{DC}$ because the high electric potential input terminal 11 is conducting with the output terminal 13. The voltage $V_{DC}$ between the low electric potential input terminal 12 and the output terminal 13 is equally divided by the transistors 14L and 15L, therefore the voltage of each transistor is $V_{DC}/2$. The voltage of the transistors 15H and 14H in the on state is 0V, and the current $i_U$ flows.

In the section v from time $dT_{SW}$ to $dT_{SW}+t_F/2$, the on/off states of the transistors 15H and 15L are complementarily switched. Specifically, the transistor 15H switches from the on state to the off state and the transistor 15L switches from the off state to the on state. Similar to the section ii, this also corresponds to the second switching control according to the present invention. As shown in FIG. 6, as the transistor 15L is switching to the on state, the current from the output terminal 13 flows through the transistor 14H in the on state and then flows through the high electric potential input terminal 11 via the capacitor 181 in the connection path 18 and the transistor 15L. Looking at the voltage and the current of the transistors 15H and 15L in FIG. 4C2, the time change rate of the voltage dv/dt is "$(V_{DC}/2)/(t_F/2)=V_{DC}/t_F$", and the time change rate of the current di/dt is the infinite. In other words, the voltage changes linearly over the section v from $dT_{SW}$ to $dT_{SW}+t_F/2$, while the current instantaneously switches at the start time $dT_{SW}$ of the section v.

In the section vi from $dT_{SW}+t_F/2$ to $dT_{SW}+t_F$, the on/off states of the transistors 14H and 14L are complementarily switched. Specifically, the transistor 14H switches from the on state to the off state and the transistor 14L switches from the off state to the on state. Similar to the section iii, this also corresponds to the first switching control according to the present invention. As shown in FIG. 6, as the transistor 14L is switching to the on state, the current from the output terminal 13 flows through the low electric potential input terminal 12 via the transistor 14L and the transistor 15L in the on state. Looking at the voltage and the current of the transistors 14H and 14L in FIG. 4C2, the time change rate of the voltage dv/dt is "$(V_{DC}/2)/(t_F/2)=V_{DC}/t_F$", and the time change rate of the current di/dt is the infinite. In other words, the voltage changes linearly over the section vi from $dT_{SW}+t_R/2$ to $dT_{SW}+t_F$, while the current instantaneously switches at the start time $dT_{SW}+t_F/2$ of the section vi.

As described above, in the section v, the second switching control in which the on/off states of the transistors 15H and 15L are complementarily switched is performed, and in the subsequent section vi, the first switching control in which the on/off states of the transistors 14H and 14L are complementarily switched is performed. As such, similar to the above sections ii and iii, the second switching control is performed before the first switching control. Besides, the timings of the second switching control and the first switching control are deviated by the transient time $t_R/2$ of the voltage switching of the respective channels of the transistors 15H and 15L in the second switching control (the section v). As such, immediately after the voltage switching of the transistors 15H and 15L in the section v, the voltage of the transistors 14H and 14L switches in the section vi without any time gap. Furthermore, as mentioned above, the time change rates of the voltage dv/dt in the sections v and vi, are equal to each other at $V_{DC}/t_F$. As a result, the voltage waveform smoothly connected at time $dT_{SW}+t_F/2$ is obtained, as shown in FIG. 4C1. As such, the aforementioned "3 level/pseudo 2 level control" is realized, not only on the rising side of the voltage pulse but also on the falling side.

FIG. 4C3 shows the switching loss of the inverter 10. The switching loss is the sum of the power consumed by each transistor 15H, 14H, 14L, and 15L through one switching operation of the inverter 10. Power is consumed when both of the voltage and the current are non-zero in each transistor 15H, 14H, 14L, and 15L, as shown in FIG. 4C2. Specifically, the transistor 15L consumes power in the section ii, the transistor 14L consumes power in the section iii, the transistor 15L consumes power in the section v, and the transistor 14L consumes power in the section vi. As shown in FIG. 4C3, the power consumed in each of the four sections ii, iii, v, and vi is represented by the area of the right triangle with a height of "$V_{DC}*(-i_U)/2$". The length of the base of each right triangle is $t_R/2$ in the sections ii, iii and $t_F/2$ in the sections v, vi. Therefore, the switching loss, which is the sum of the areas of these four right triangles, is expressed as "$t_R*V_{DC}*(-i_U)/4+t_F*V_{DC}*(-i_U)/4$". Here, the power consumed by each transistor 15L and 14L is represented by the area of the right triangle, because the time change rate of the current di/dt in each section ii, iii, v, and vi is the infinite and the current changes instantaneously in the direction perpendicular to the time axis.

In the inverter 10 described above, the capacitor 181 provided in the connection path 18 stabilizes the operation by maintaining the voltage between the connection portion 18H of the transistors on the high electric potential side and the connection portion 18L of the transistors on the low electric potential side, to be around the intermediate voltage $V_{DC}/2$. In other words, the capacitor 181 functions as a voltage fluctuation suppression element that suppresses fluctuation of the voltage between the connection portion 18H on the high electric potential side and the connection portion 18L on the low electric potential side. FIGS. 7B4 and FIG. 7C4 show the current and the voltage of the capacitor 181. The FIG. 7B2, FIG. 7B3, FIG. 7C2, and FIG. 7C3 are the same as in FIG. 4A to FIG. 4C3 for reference.

In FIG. 7 B4 in case the current $i_U$ is positive, the current flows through the capacitor 181 in the sections ii and vi. As shown in FIG. 5, in the section ii, the current flows in the direction from the high electric potential side connection portion 18H to the low electric potential side connection portion 18L so that the capacitor 181 stores the charge, and in the section vi, the current flows in the direction from the low electric potential side connection portion 18L to the high electric potential side connection portion 18H so that the capacitor 181 releases the charge. The voltage between the electrodes of the capacitor 181 oscillatively changes slightly between the charge storing state and the charge releasing state, centered around the intermediate voltage $V_{DC}/2$. In an ideal situation, the magnitudes of the current flowing through the capacitor 181 in the sections ii, vi and the flowing times $t_R/2$ and $t_F/2$ are equal, respectively, and the charge of the capacitor 181 does not increase or decrease through one switching operation of the inverter 10.

In FIG. 7C4 in case the current $i_U$ is negative, the current flows through the capacitor 181 in the sections iii and v. As shown in FIG. 6, in the section iii, the current flows in the direction from the low electric potential side connection portion 18L to the high electric potential side connection portion 18H so that the capacitor 181 releases the charge, and in the section v, the current flows in the direction from the high electric potential side connection portion 18H to the low electric potential side connection portion 18L so that the capacitor 181 stores the charge. The voltage between the electrodes of the capacitor 181 oscillatively changes slightly between the charge storing state and the charge releasing state, centered around the intermediate voltage $V_{DC}/2$. In an ideal situation, the magnitudes of the current flowing through the capacitor 181 in the sections iii, v and the flowing times $t_R/2$ and $t_R/2$ are equal, respectively, and the charge of the capacitor 181 does not increase or decrease through one switching operation of the inverter 10.

FIG. 8B1 to FIG. 8C4 shows an example where there is the increase and/or the decrease of the charge of the capacitor 181 through one switching operation of the inverter 10. FIG. 8B1 through FIG. 8B4 and FIG. 8C1 through FIG. 8C4 correspond to FIGS. 4B1, FIG. 4C3 and FIGS. 7B2 to FIG. 7C4.

In FIG. 7B2, which shows the output of the inverter 10 in case the current $i_U$ is positive, and in FIG. 7C2, which shows the output of the inverter 10 in case the current $i_U$ is negative, the voltage pulse waveforms are distorted from the trapezoidal shape in FIGS. 4A1 to FIG. 4C3. The reason is that the transient time required for the second switching control "$t_a=t_{aR}=t_{aF}$" and the transient time required for the first switching control "$t_b=t_{bR}=t_{bF}$" are different, as shown in FIGS. 7B2 and FIG. 7C2, which show the voltage and the current of each transistor. This FIG. shows the case where $t_a$ is larger than $t_b$, but the voltage pulse waveform is distorted from the trapezoidal shape even when $t_a$ is smaller than $t_b$.

In FIG. 7B4 in case the current $i_U$ is positive, the capacitor 181 stores excessive charge through one switching operation of the inverter 10, because the time $t_{aF}$ for the capacitor 181 to store the charge is longer than the time tor for the capacitor 181 to release the charge. In FIG. 7C4 in case the current $i_U$ is negative, the capacitor 181 stores excessive charge through one switching operation of the inverter 10, because the time $t_{aF}$ for the capacitor 181 to store the charge is longer than the time $t_{bR}$ for the capacitor 181 to release the charge. In either case, the voltage between the electrodes of the capacitor 181 shifts in the positive direction through one switching operation of the inverter 10, which could interfere with the stable operation of the inverter 10. It should be noted that, although not shown in the FIGS. 7B2 to FIG. 7C4, in case $t_a$ is smaller than $t_b$, contrary to this FIGS. 7 B2 to FIG. 7C4, the capacitor 181 releases excessive charge through one switching operation of the inverter 10, so that the voltage between the electrodes of the capacitor 181 shifts in the negative direction, which could interfere with the stable operation of the inverter 10.

FIG. 9 shows two examples of a configuration of a correction device 40 that corrects for the aforementioned imbalance in the switching time. These correction devices 40 control the transient time "$t_b=t_{bR}=t_{bF}$" for the first voltage switching and the transient time "$t_a=t_{aR}=t_{aF}$" for the second voltage switching, so that the center voltage of the capacitor 181 is the intermediate voltage $V_{DC}/2$ as the target voltage. The controller 100 in FIG. 2 controls the input voltage $v_{GS}$ to each driver 30 in FIG. 3A and FIG. 3B in accordance with these transient times $t_a$ and $t_b$.

Figures 9A, 9B:
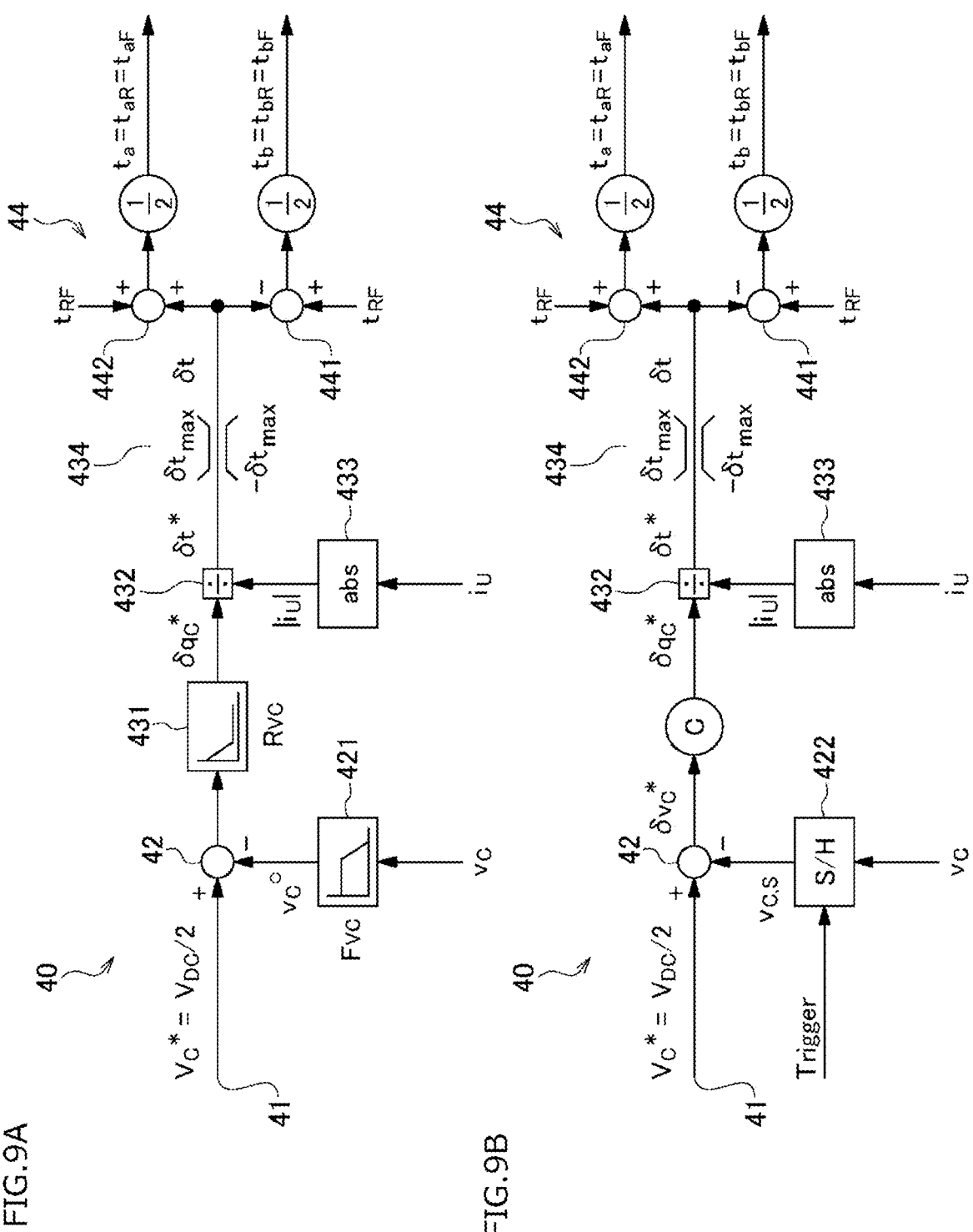
FIG. 9A and FIG. 9B show an example of a configuration of a correction device that corrects for imbalance in switching time.

In the correction device 40 according to the first configuration example in FIG. 9A, the target voltage providing unit 41 provides the target voltage $V_{DC}/2$ of the capacitor 181. The voltage error calculation unit 42 calculates an error of the measured voltage $v_c$ of the capacitor 181 from the target voltage $V_{DC}/2$. In the first configuration example, the voltage $v_c$ of the capacitor 181 is regularly measured, and its high-frequency component is removed by the low-pass filter 421. Then, the low-frequency component is provided to the voltage error calculation unit 42. The voltage error calculated by the voltage error calculation unit 42 is provided to the voltage controller 431 and converted into a charge correction amount of the capacitor 181. The dividing unit 432 divides the charge correction amount by the absolute value of the output current $i_U$ obtained from the absolute value calculation unit 433 and converts it into a time correction amount. The regulator 434 performs a capping process based on a predetermined upper limit value to prevent the absolute value of this time correction amount from becoming too large and makes it the final time correction amount St.

The switching time correction unit 44 corrects at least one of the transient time to for the first voltage switching and the transient time $t_a$ for the second voltage switching, based on the voltage error calculated by the voltage error calculation unit 42. In the present configuration example, the first correction unit 441 that calculates a correction value for the first transient time to and the second correction unit 442 that calculates a correction value for the second transient time $t_a$, are provided. The first correction unit 441 subtracts the time correction amount δt from the rise time/fall time $t_{RF}$ ($=t_R=t_F$) of the inverter 10 and multiplies it by ½ to obtain the correction value for the first transient time to. That is, $t_b=(t_{RF}-δt)/2$. The second correction unit 442 adds the time correction amount δt to the rise time/fall time $t_{RF}$ ($=t_R=t_F$) of the inverter 10 and multiplies it by ½ to obtain the correction value for the second transient time $t_a$. That is, $t_a=(t_{RF}+δt)/2$. Here, the sum of the first transient time to and the second transient time $t_a$ is equal to the rise time/fall time $t_{RF}$ of the inverter 10. Therefore, it can be said that the switching time correction unit 44 specifies by the time correction amount St, the optimum distribution ratio when distributing $t_{RF}$ to the first transient time to and the second transient time $t_a$, so that the voltage of the capacitor 181 is the target voltage $V_{DC}/2$.

In the correction device 40 according to the second configuration example in FIG. 9B, the sample/hold circuit 422 provides the voltage $v_c$ of the capacitor 181 acquired based on the trigger signal to the voltage error calculation unit 42. The voltage error calculated by the voltage error calculation unit 42 is multiplied by the capacitance value C of the capacitor 181 and converted into a charge correction amount of the capacitor 181. The remaining is the same as the first configuration example in FIG. 9A.

The present invention has been described above based on embodiments. It will be understood by those skilled in the art that the embodiments are examples, that various variations are possible in the combination of the respective components and/or the respective processing steps, and that such variations are also within the scope of the present invention.

The embodiment has described the inverter 10 that outputs AC power based on input DC power, but conversely, the present invention can also be applied to a converter that outputs DC power based on input AC power. In the configuration of the inverter 10 in FIG. 2, the basic configuration of the converter is realized, by converting what was the output terminal 13 into an input terminal to which AC power is input, and converting what were the high electric potential input terminal 11 and the low electric potential input terminal 12 into a high electric potential output terminal and a low electric potential output terminal that output DC power, respectively.

In the embodiment, the "3 level/pseudo 2 level control" of the inverter 10 has been described with reference to FIG. 2 and FIG. 4A to FIG. 4C3. Specifically, using two transistor pairs 14 and 15 capable of outputting three levels of voltage (0V, $V_{DC}/2$, and $V_{DC}$), the voltage pulse with two pseudo levels (0V and $V_{DC}$) as shown in FIGS. 4B1 and FIG. 4C1 was formed. According to the present invention, "N level/pseudo M level control" can be realized, with N as any natural number of 2 or more and M as any natural number of 2 or more and N–1 or less. 2 level control with N=2 can be realized by one transistor pair. 4 level control with N=4 can be realized by three transistor pairs. As such, N level control can be realized by N–1 transistor pairs. In this case, as in FIG. 4A to FIG. 4C3 showing an example of 3 level control, N level voltage can be output by performing switching controls in order from a transistor pair far from the output terminal 13. In order to form a pseudo M level voltage pulse based on such an N level voltage, the switching controls of adjacent transistor pairs will be performed continuously, and the voltage pulses will be connected smoothly, as described with respect to FIG. 4A to FIG. 4C3.

A more specific configuration is as follows. With n ($=N-1$) being an integer of 2 or more, first to n$^{th}$ transistor pairs are configured by first to n$^{th}$ high electric potential transistors connected in series from the output terminal 13 to the high electric potential input terminal 11, and first to n$^{th}$ low electric potential transistors connected in series from the output terminal 13 to the low electric potential input terminal 12. First to n$^{th}$ drivers that perform the switching control for the first to n$^{th}$ transistor pairs are provided. First to n–1$^{th}$ connection paths that interconnect the high electric potential side connection portions and the low electric potential side connection portions of adjacent transistor pairs are provided. First to n–1$^{th}$ voltage fluctuation suppression elements are provided in the first to n–1$^{th}$ connection paths to suppress the fluctuation of voltage between the high electric potential side connection portions and the low electric potential side connection portions. The switching controls of adjacent transistor pairs are performed with a predetermined time gap. Specifically, the timing of the switching control of the respective transistor pairs is earlier for a transistor pair on the far side from the output terminal 13. In particular, it is preferable to stagger the timings of the switching controls of adjacent transistor pairs, by the transient time of the voltage switching of the respective current paths of the high electric potential transistor and the low electric potential transistor configuring the respective transistor pairs.

Figure 10:
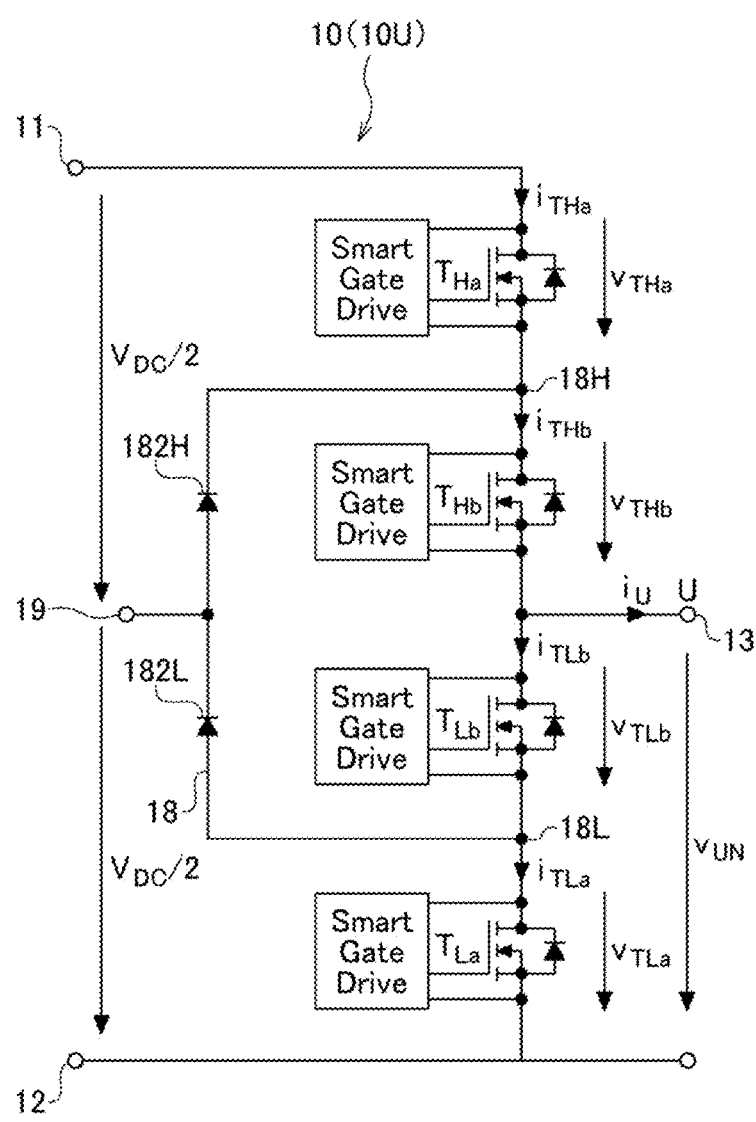
FIG. 10 shows an example of a configuration where a diode is provided in the connection path instead of a capacitor.

In the embodiment, the capacitor 181 as the voltage fluctuation suppression element has been provided in the connection path 18, to maintain the voltage between its electrodes around $V_{DC}/2$ and stabilize the operation of the inverter 10. The similar effect can be achieved by using a diode as the voltage fluctuation suppression element instead of the capacitor 181. FIG. 10 shows an example of such a configuration. In the connection path 18 of the inverter 10, two diodes 182L and 182H are provided in series that flow the current in the direction from the connection portion 18L of the transistors on the low electric potential side to the connection portion 18H of the transistors on the high electric potential side. The connection portion 19 of these two diodes 182L and 182H is connected to the intermediate electric potential of the high electric potential Vdd and the low electric potential Vss, namely "(Vdd–Vss)/2=$V_{DC}/2$". Since the intermediate electric potential is connected to a constant electric potential, the diodes 182L and 182H function as the voltage fluctuation suppression elements that suppress fluctuation of voltage between the high electric potential side connection portion 18H and the low electric potential side connection portion 18L.

In the embodiment, an example in which the respective transistor pairs is configured by one high electric potential transistor and one low electric potential transistor has been described, but there may be a plurality of high electric potential transistors and low electric potential transistors configuring each transistor pair. As an example of a technology that configures a pair with a plurality of high electric potential transistors and a plurality of low electric potential transistors, a modular multilevel converter (MMC) is known. This provides a group of circuit elements called a cell with the same configuration in pair on the high electric potential side and the low electric potential side. Each cell includes a plurality of transistors connected in series and/or connected in parallel. By adjusting di/dt to be larger than dv/dt in the switching controls of these transistors, effects such as reduction of switching loss equivalent to those described in the embodiment can be obtained.

It should be noted that the functional configuration of each device described in the embodiment can be realized by hardware resources or software resources, or by collaboration of hardware resources and software resources. As hardware resources, processor, ROM, RAM, and other LSI can be utilized. As software resources, operating system, application, and other program can be utilized.

In the embodiments disclosed in the present specification, some or all of a plurality of functions provided in a distributed manner may be provided by incorporating into an integral function, and conversely an integral function incorporating a plurality of functions may be provided by distributing some or all of the plurality of functions. Regardless of whether the functions are incorporated or distributed, it is sufficient if they are configured so that the purpose of the present invention can be achieved.

The present invention relates to control technology for inverter and/or converter.

REFERENCE SIGNS LIST 1 motor device, 10 inverter, 11 high electric potential input terminal, 12 low electric potential input terminal, 13 output terminal, 14 first transistor pair, 15 second transistor pair, 16 first driver, 17 second driver, 18 connection path, 20 motor, 30 driver, 32 operational amplifier, 33 gate resistor, 34 mirror capacitor, 35 capacitor, 40 correction device, 41 target voltage providing unit, 42 voltage error calculation unit, 44 switching time correction unit, 181 capacitor, 182 diode.

What is claimed is:

1. An inverter comprising:

an input terminal including a high electric potential input terminal with high electric potential and a low electric potential input terminal with low electric potential, wherein DC power is input between both input terminals;

an output terminal that outputs AC power;

a transistor pair comprising a high electric potential transistor having a current path connecting the high electric potential input terminal side and the output terminal side, and a low electric potential transistor having a current path connecting the low electric potential input terminal side and the output terminal side; and a driver that inputs a control signal to the respective high electric potential transistor and the low electric potential transistor to perform switching control to convert the DC power to the AC power by complementarily switching the conduction state of the respective current paths, wherein the driver includes at least one of a current adjustment element that adjusts the current of the respective current paths and a voltage adjustment element that adjusts the voltage of the respective current paths, and at least one of the current adjustment element and the voltage adjustment element adjusts, in the switching control, the time change rate of the current of the respective current paths to be larger than the time change rate of the voltage of the respective current paths, wherein the transistor pair, wherein n is an integer of 2 or more, includes first to n$^{th}$ transistor pairs configured by first to n$^{th}$ high electric potential transistors connected in series from the output terminal to the high electric potential input terminal, and first to n$^{th}$ low electric potential transistors connected in series from the output terminal to the low electric potential input terminal, and the driver includes first to n$^{th}$ drivers that perform the switching control for the first to n$^{th}$ transistor pairs, wherein the inverter comprises:

first to n–1$^{th}$ connection paths that interconnect the high electric potential side connection portions and the low electric potential side connection portions of adjacent transistor pairs; and first to n–1$^{th}$ voltage fluctuation suppression elements provided in the respective connection paths to suppress the fluctuation of voltage between the high electric potential side connection portions and the low electric potential side connection portions, wherein the switching control of adjacent transistor pairs is performed with a predetermined time gap.

2. The inverter according to claim 1, wherein the timing of the switching control of the respective transistor pairs is earlier for a transistor pair remote from the output terminal.

3. The inverter according to claim 1, wherein the predetermined time gap is the transient time in the switching control of voltage switching of the current paths of the respective high electric potential transistor and the low electric potential transistor configuring the transistor pair.

4. The inverter according to claim 1, wherein the voltage fluctuation suppression element is a capacitor.

5. The inverter according to claim 4, further comprising:

a target voltage providing unit that provides a target voltage of the capacitor;

a voltage error calculation unit that calculates an error of the measured voltage of the capacitor from the target voltage; and a switching time correction unit that corrects the transient time of voltage switching of the current paths of the respective high electric potential transistor and the low electric potential transistor configuring at least one of the adjacent transistor pairs, based on the error.

6. The inverter according to claim 1, wherein the voltage fluctuation suppression element is two diodes connected in series that flow current in a direction from the low electric potential side connection portion to the high electric potential side connection portion, and the connection portion of the two diodes is connected to intermediate electric potential between the high electric potential and the low electric potential.

7. A method of controlling an inverter, wherein the inverter comprises:

an input terminal including a high electric potential input terminal with high electric potential and a low electric potential input terminal with low electric potential, wherein DC power is input between both input terminals;

an output terminal that outputs AC power;

a transistor pair comprising a high electric potential transistor having a current path connecting the high electric potential input terminal side and the output terminal side, and a low electric potential transistor having a current path connecting the low electric potential input terminal side and the output terminal side, wherein the method comprises a switching control operation to input a control signal by a driver to the respective high electric potential transistor and the low electric potential transistor to convert the DC power to the AC power by complementarily switching the conduction state of the respective current paths, wherein the method adjusts, in the switching control, the time change rate of the current of the respective current paths to be larger than the time change rate of the voltage of the respective current paths, wherein the transistor pair, wherein n is an integer of 2 or more, includes first to $n^{th}$ transistor pairs configured by first to $n^{th}$ high electric potential transistors connected in series from the output terminal to the high electric potential input terminal, and first to $n^{th}$ low electric potential transistors connected in series from the output terminal to the low electric potential input terminal, and the driver includes first to $n^{th}$ drivers that perform the switching control for the first to $n^{th}$ transistor pairs, wherein the inverter comprises:

first to $n-1^{th}$ connection paths that interconnect the high electric potential side connection portions and the low electric potential side connection portions of adjacent transistor pairs; and first to $n-1^{th}$ voltage fluctuation suppression elements provided in the respective connection paths to suppress the fluctuation of voltage between the high electric potential side connection portions and the low electric potential side connection portions, wherein the switching control of adjacent transistor pairs is performed with a predetermined time gap.

8. A program of controlling an inverter, wherein the inverter comprises:

an input terminal including a high electric potential input terminal with high electric potential and a low electric potential input terminal with low electric potential, wherein DC power is input between both input terminals;

an output terminal that outputs AC power;

a transistor pair comprising a high electric potential transistor having a current path connecting the high electric potential input terminal side and the output terminal side, and a low electric potential transistor having a current path connecting the low electric potential input terminal side and the output terminal side, wherein the program causes a computer to perform a switching control operation to input a control signal by a driver to the respective high electric potential transistor and the low electric potential transistor to convert the DC power to the AC power by complementarily switching the conduction state of the respective current paths, wherein the program adjusts, in the switching control, the time change rate of the current of the respective current paths to be larger than the time change rate of the voltage of the respective current paths, wherein the transistor pair, wherein n is an integer of 2 or more, includes first to $n^{th}$ transistor pairs configured by first to $n^{th}$ high electric potential transistors connected in series from the output terminal to the high electric potential input terminal, and first to $n^{th}$ low electric potential transistors connected in series from the output terminal to the low electric potential input terminal, and the driver includes first to $n^{th}$ drivers that perform the switching control for the first to $n^{th}$ transistor pairs, wherein the inverter comprises:

first to $n-1^{th}$ connection paths that interconnect the high electric potential side connection portions and the low electric potential side connection portions of adjacent transistor pairs; and first to $n-1^{th}$ voltage fluctuation suppression elements provided in the respective connection paths to suppress the fluctuation of voltage between the high electric potential side connection portions and the low electric potential side connection portions, wherein the switching control of adjacent transistor pairs is performed with a predetermined time gap.

* * * * *